(12) United States Patent
Kotlanka et al.

(10) Patent No.: US 8,513,767 B2
(45) Date of Patent: Aug. 20, 2013

(54) PACKAGE INTERCONNECTS

(75) Inventors: Rama Krishna Kotlanka, Singapore (SG); Rakesh Kumar, Singapore (SG); Premachandran Chirayarikathuveedu Sankarapillai, Singapore (SG); Pradeep Ramachandramurthy Yelehanka, Singapore (SG)

(73) Assignee: Globalfoundries Singapore Pte. Ltd., Singapore (SG)

( * ) Notice: Subject to any disclaimer, the term of this patent is extended or adjusted under 35 U.S.C. 154(b) by 221 days.

(21) Appl. No.: 13/052,134

(22) Filed: Mar. 21, 2011

(65) Prior Publication Data

US 2012/0241901 A1   Sep. 27, 2012

(51) Int. Cl.
*H01L 23/48* (2006.01)
*H01L 21/768* (2006.01)
*H01L 21/76* (2006.01)

(52) U.S. Cl.
USPC ........................................ 257/506

(58) Field of Classification Search
USPC ............ 257/E21.575–E21.597, E21.627, 257/E21.641, 637–640, 668, 672, 675, E23.021, 257/E23.069, 527, 594, 618, 622, 678–733, 257/787–796; 438/424, 618, 629, 630, 637–640, 668, 672, 438/675
See application file for complete search history.

(56) References Cited

U.S. PATENT DOCUMENTS

| | | | | |
|---|---|---|---|---|
| 5,739,579 A | * | 4/1998 | Chiang et al. | 257/635 |
| 2008/0315253 A1 | * | 12/2008 | Yuan et al. | 257/190 |
| 2010/0276766 A1 | * | 11/2010 | Tang et al. | 257/419 |
| 2011/0204523 A1 | * | 8/2011 | Arnold et al. | 257/773 |

* cited by examiner

*Primary Examiner* — Dao H Nguyen
*Assistant Examiner* — Tram H Nguyen
(74) *Attorney, Agent, or Firm* — Horizon IP Pte. Ltd.

(57) ABSTRACT

A method for forming a device is disclosed. A support substrate having first and second major surfaces is provided. An interconnect is formed through the first and second major surfaces in the support substrate. The interconnect has first and second portions. The first portion extends from one of the first or second major surfaces and the second portion extends from the other of the first and second major surfaces. The interconnect includes a partial via plug having a conductive material in a first portion of the interconnect. The via plug has a bottom at about an interface of the first and second portions. The second portion of the interconnect is heavily doped with dopants of a first polarity type.

20 Claims, 17 Drawing Sheets

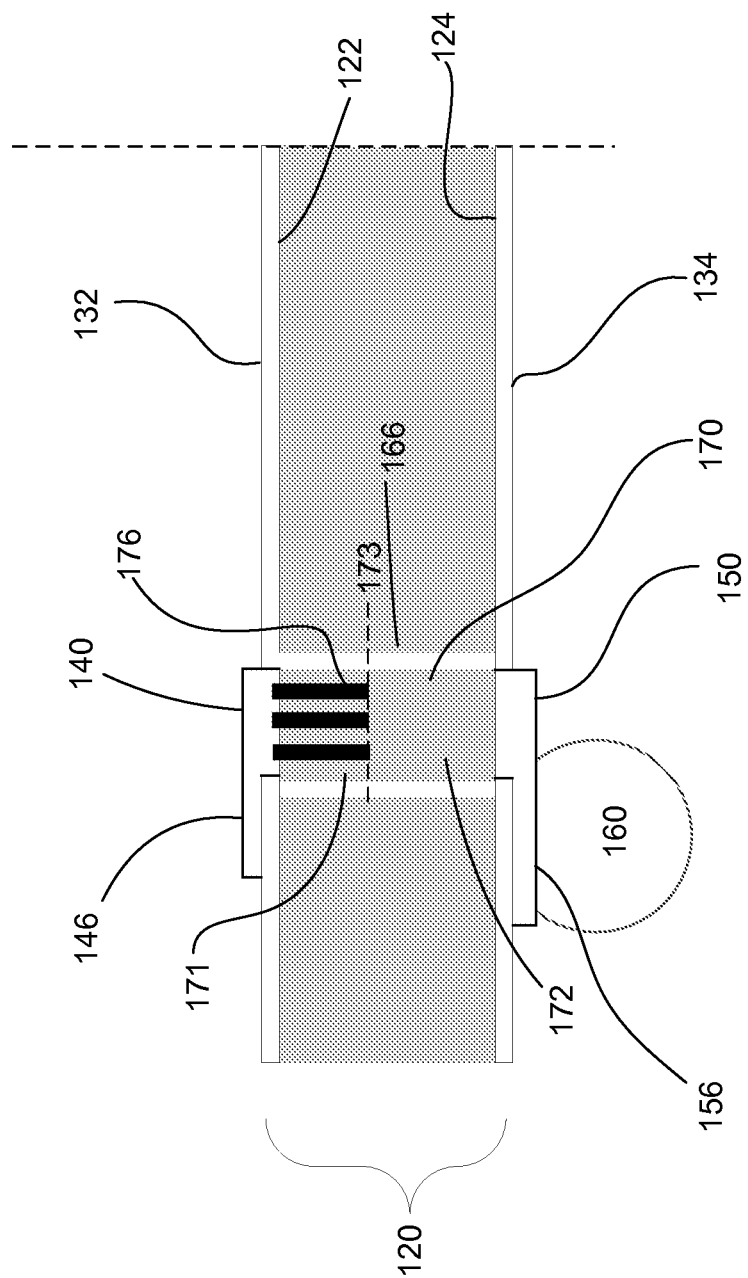

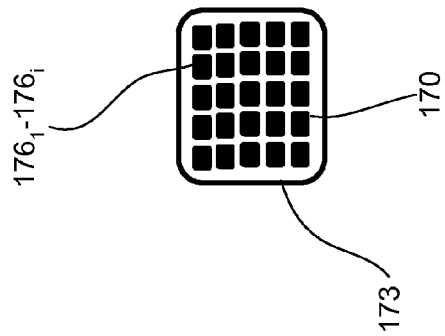
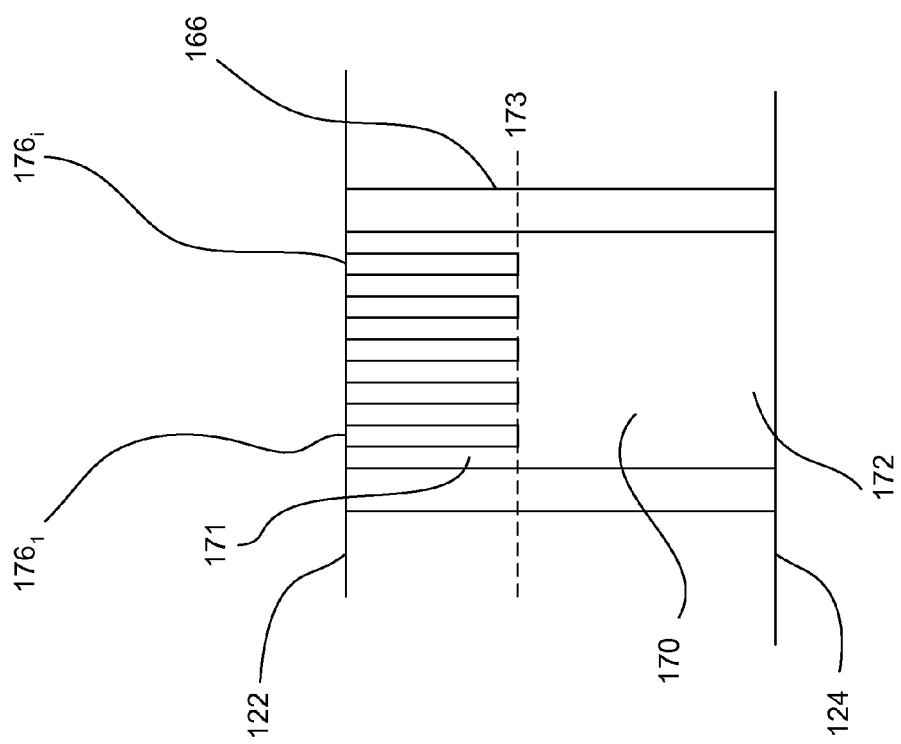

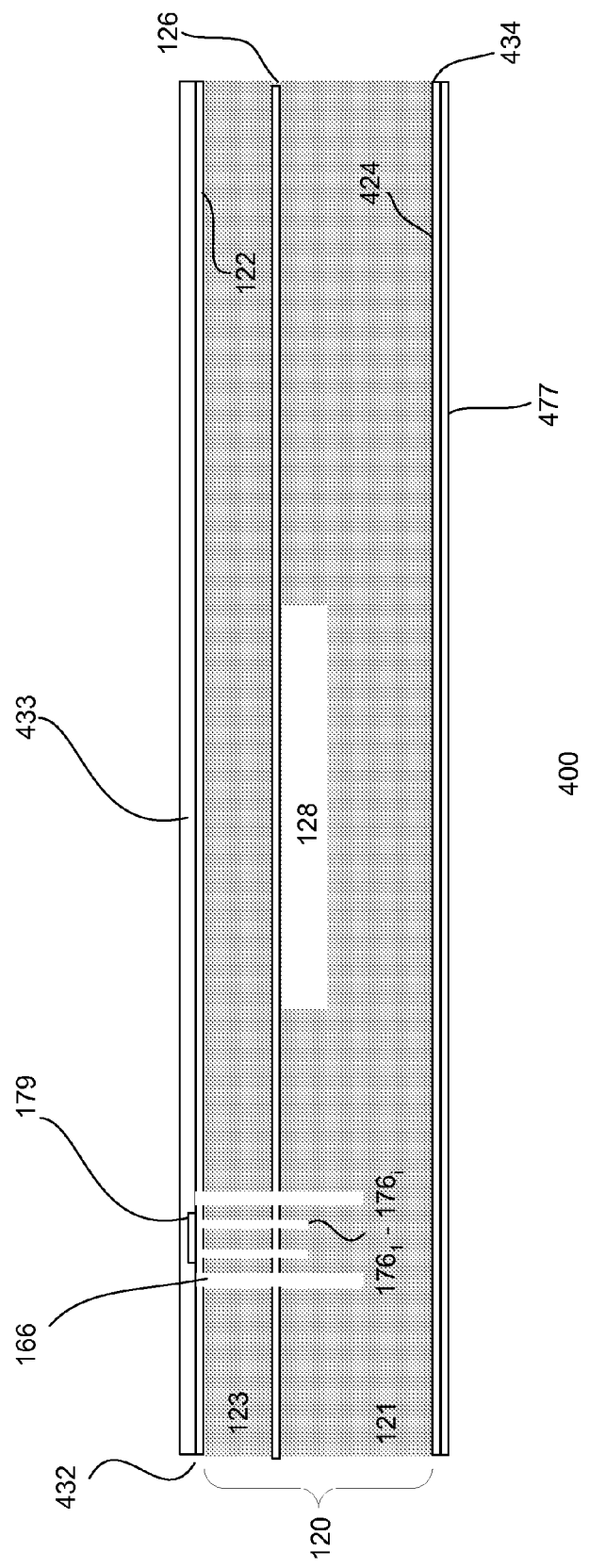

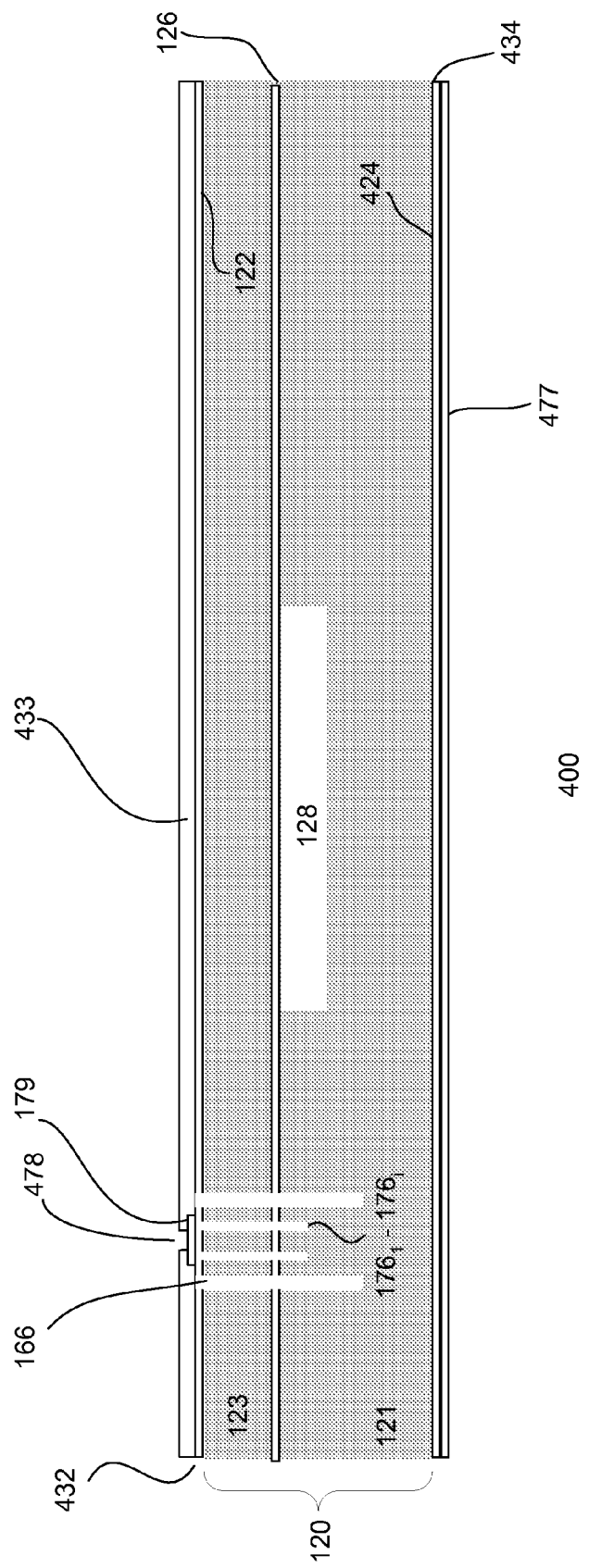

… (US 8,513,767 B2)

PACKAGE INTERCONNECTS

BACKGROUND

Wafer level packaging has been proposed to stack wafers together to produce extremely dense electronic packages. Through silicon via (TSV) process is one of the techniques used in wafer level packaging. It enables the production of small form factor devices and stacking of wafers to provide integration. Although TSV may provide higher reliability and less parasitic effect, it, however, requires long processing time to etch deep vias, for example, having a depth of about 150 μm. Furthermore, TSV is a relatively expensive technique and also produces high stress which may impact yield. This reduces throughput and leads to an increase in the manufacturing cost of the devices.

It is desirable to provide packages with increased density, high reliability and low manufacturing cost.

SUMMARY

A method for forming a device is presented. The method includes providing a support substrate having first and second major surfaces. The method further includes forming an interconnect through the first and second major surfaces in the support substrate. The interconnect has first and second portions. The first portion extends from one of the first or second major surfaces and the second portion extends from other of the first and second major surfaces. The interconnect includes a partial via plug having a conductive material in a first portion of the interconnect. The via plug has a bottom at about an interface of the first and second portions. The second portion of the interconnect is heavily doped with dopants of a first polarity type.

In one embodiment, a method for forming a semiconductor package is disclosed. The method includes providing a support substrate having first and second major surfaces. The method also includes forming an interconnect through the first and second major surfaces in the support substrate. The interconnect has first and second portions. The first portion extends from one of the first or second major surfaces and the second portion extends from other of the first and second major surfaces. The interconnect includes a partial via plug having a conductive material in a first portion of the interconnect. The via plug has a bottom at about an interface of the first and second portions. The second portion of the interconnect is heavily doped with dopants of a first polarity type. The method further includes providing a semiconductor device over the support substrate.

In another embodiment, a device is disclosed. The device includes a support substrate having first and second major surfaces. The device also includes an interconnect through the first and second major surfaces in the support substrate. The interconnect has first and second portions. The first portion extends from one of the first or second major surfaces and the second portion extends from other of the first and second major surfaces. The interconnect includes a partial via plug having a conductive material in a first portion of the interconnect. The via plug has a bottom at about an interface of the first and second portions and the second portion of the interconnect is heavily doped with dopants of a first polarity type.

These embodiments, along with other advantages and features herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIGS. 1a-d show cross-sectional views of various embodiments of a device;

FIGS. 2a-b show a cross-sectional and plan views of an embodiment of an interconnect;

FIGS. 4a-k show an embodiment of a process for forming a device.

DETAILED DESCRIPTION

The embodiments generally relate to devices. The devices may be, for example, semiconductor devices. In other embodiments, the devices may be hybrid types of devices which include MEMS and semiconductor or IC devices. The MEMS devices may be various types of MEMS devices, such as RF MEMS, Inertial MEMS or BioMEMS. Other types of MEMS devices may also be used. In particular, the embodiments relate to interconnects which facilitate packaging of the devices. The embodiments may be employed in, for example, wafer level packaging techniques. The devices may be incorporated into, for example, products such as accelerometers, gyroscope or resonators. Other types of products may also be useful.

Figure 1B:
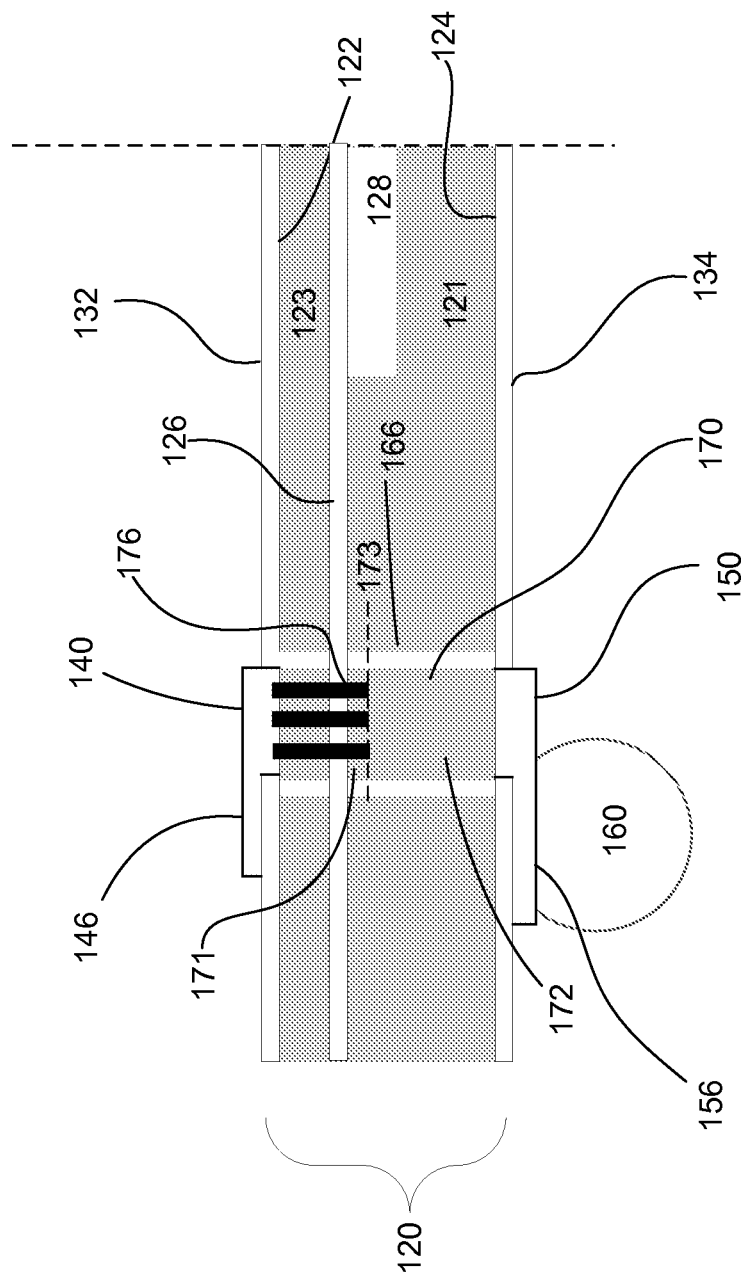

FIGS. 1a-d show cross-sectional views of a portion of various embodiments of a device 100. The portion may, for example, be half of the device. Referring to FIG. 1a, a support substrate 120 is provided. The support substrate may serve as a handler substrate or handler wafer. For example, the handler substrate may be a package or a part of a package of the device. In the case of a handler wafer, it may be used for wafer level packaging. In some embodiments, the support substrate may be a micro-electromechanical system (MEMS) device. The support substrate includes first and second major substrate surfaces 122 and 124. The first major surface, for example, is a top surface while the second major surface is a bottom surface. For example, the top surface may provide a surface on which a semiconductor or IC device is mounted.

In one embodiment, the support substrate comprises a semiconductor material, such as a crystalline material. For example, the support substrate comprises silicon. Other types of semiconductor materials, such as silicon-germanium (SiGe), germanium (Ge), gallium-arsenic (GaAs) or any other suitable semiconductor materials, including subsequently developed materials, may also be used to serve as the support structure. The thickness of the handler substrate, for example, may range from about 150 to 725 μm for a 200 mm wafer. Providing handler substrates with other thicknesses may also be useful.

The support substrate may be doped with dopants having a polarity type. For example, the substrate may be doped with p-type or n-type dopants. P-type dopants can include boron (B), aluminum (Al), indium (In) or a combination thereof, while n-type dopants can include phosphorus (P), arsenic (As), antimony (Sb) or a combination thereof. In other embodiments, the substrate may be an intrinsic substrate.

In one embodiment, the handler substrate may be a heavily doped substrate. In one embodiment, the substrate comprises a heavily doped n-type ($n^+$) substrate. Providing a heavily doped p-type ($p^+$) substrate may also be useful. The dopant concentration of the substrate should be sufficient to provide a low sheet resistance. The dopant concentration, in one embodiment, should be sufficient to provide a sheet resistance of about 0.05 Ωcm or lower. Providing a substrate having other sheet resistance values may also be useful.

The first and second major substrate surfaces are provided with first and second surface dielectric layers 132 and 134. The dielectric layers, for example, may be silicon oxide. Other types of dielectric materials, such as silicon nitride, may also be used to serve as the dielectric layer. It is understood that the first and second dielectric layers need not be formed of the same material.

The first substrate surface includes first contact pads 146 formed on first conductive traces 140. The arrangement or layout of the first contact pads facilitates, for example, electrical coupling to contacts of a semiconductor device which is mounted on the first substrate surface. For example, the first contact pad layout facilitates connections to contacts of a flip chip. The first contact pad layout may also be used to facilitate connections to other types of chip via wire bonding techniques. The second substrate surface includes second contact pads 156 formed on second conductive traces 150. Package contacts 160, such as conductive contact balls are formed on the second contact pads. The package contacts, for example, may comprise solder balls. Other types of package contacts may also be useful. The arrangement or layout of the second contact pads may form a ball grid array (BGA) format. Providing other types of second contact pad layouts to provide other package contacts configurations may also be useful. The contact pads and conductive traces may be formed from a conductive material, such as copper or copper alloy. Forming conductive traces and contact pads using other types of conductive materials may also be useful. The conductive traces and contact pads are isolated from the support substrate by the surface dielectric layers.

Interconnects 170 are disposed in the substrate to provide electrical connections between the first and second conductive traces on the first and second major surfaces. This allows the first contact pads to be electrically coupled to the second contact pads and package contacts. The electrical traces may serve as redistribution layers to facilitate the desired first and second contact pad layouts on the first and second surfaces.

An interconnect generally provides an electrical connection between respective first and second contact pads. The interconnect, for example, provides electrical connections to both surfaces of the substrate. In some cases, an interconnect may provide an interconnection to more than one contact pads on a surface. For example, some contact pads may be common contacts on a surface.

In one embodiment, an interconnect is isolated from other parts of the support substrate by an interconnect dielectric layer 166. The interconnect dielectric layer, for example, may be silicon oxide. Other types of dielectric material may also be useful to serve as the interconnect dielectric layer. In one embodiment, the interconnect dielectric layer surrounds the interconnect and extends from the first to the second major surface of the substrate.

The interconnect may have a rectangular cross-sectional shape. The diameter of the cross-section may be, for example, about 40 μm. Providing an interconnect having other cross-sectional shapes or sizes may also be useful.

The interconnect, in one embodiment, comprises a doped region of the substrate. In one embodiment, the interconnect is a heavily doped interconnect region. For example, the interconnect is a heavily doped interconnect region with dopants of a first polarity type. The first polarity type may be n-type, forming a heavily doped n-type ($n^+$) interconnect region. Providing a heavily doped p-type ($p^+$) interconnect region may also be useful. The dopant concentration of the heavily doped region should be sufficient to provide a low sheet resistance. The dopant concentration, in one embodiment, should be sufficient to provide a sheet resistance of about 0.05 Ωcm or lower. Providing a doped region having other sheet resistance values may also be useful.

The interconnect, in one embodiment, may have the same dopant type and concentration as the support substrate. For example, the substrate comprises a heavily doped substrate with dopants of the first polarity type. In one embodiment, the substrate may be an $n^-$ doped substrate for a $n^-$ interconnect. In other embodiments, the support substrate may have different polarity type dopants of different dopant concentration than the interconnect region. For example, the substrate may be intrinsic or doped with different dopants or different doping concentration than the interconnect. In such cases, the interconnect may be separately doped by, for example, ion implantation using an implant mask.

The interconnect includes first and second portions 171 and 172. The first portion is from one of the major surfaces and the second portion is from the other of the major surfaces of the substrate. An interface 173 of the first and second portions of the interconnect is disposed within the substrate.

The first portion of the interconnect includes at least one partial conductive via plug 176. The partial conductive via plug has a surface end extending from one of the major surfaces of the substrate. The partial conductive via plug has a surface end and an inner end. The surface end of the partial via is, for example, about co-planar with a surface of the support substrate. The surface end, in one embodiment, is coupled to the conductive trace on the surface of the substrate. The inner end of the partial conductive via plug is disposed at about the interface 173 of the first and second portions of the interconnect. As such, the partial conductive via plug does not extend from one major surface to the other major surface.

As shown, the first portion is an upper portion of the interconnect. For example, the first portion is formed from the upper (or first) surface of the substrate. In other embodiments, the first portion may be a lower portion of the interconnect. For example, the first portion is formed from the lower (or second) surface of the substrate.

The conductive via plug or plugs, in one embodiment, comprises polysilicon doped with dopants of the same polarity type as the interconnect region. For example, the polysilicon plug is doped with first polarity type dopants. The first polarity type may be n-type (n) or p-type (p). In one embodiment, the conductive via plug comprises polysilicon heavily doped with dopants of the first polarity type. For example, the conductive via plug may be a heavily doped n-type ($n^+$) or p-type ($p^+$) polysilicon via plug. The use of polysilicon enables a via first approach and is useful in high temperature processing. In other embodiments, the conductive via plug may comprise conductive materials, such as copper (Cu), tungsten (W) or aluminum (Al). Providing other types of conductive materials may also be useful. The materials may be selected depending on the temperature used in the process.

The second portion of the interconnect comprises the substrate material heavily doped with the first polarity type dopants. The heavily doped portion of the interconnect form an electrical connection between the partial conductive via plugs and the substrate material of the interconnect region. This creates electrical connections between the first and second electrical traces on the first and second substrate surfaces without the need of through contact plugs which extend from one major surface to the other major surface of the support substrate.

FIG. 1b shows another embodiment of a device 100. The device is similar to that described in FIG. 1a. Similar reference numerals designate similar elements. Similar elements may not be discussed in detail. As shown, a support substrate 120 is provided. The support substrate, for example, comprises a semiconductor material and serves as a handler substrate. In one embodiment, the support substrate comprises a cavity substrate having a cavity 128. The cavity substrate, for example, may be used to form MEMS devices such as RF MEMS or Inertial MEMS. Forming other types of MEMS devices may also be useful. The MEMS devices, for example, are incorporated into products such as microphones, pressure sensor or energy harvesters. The MEMS devices may also be used in other types of products.

In one embodiment, the cavity substrate includes a main or bulk substrate 121 having a cavity 128 and a surface substrate 123. The bulk substrate may optionally be separated by a buried dielectric layer 126. Such a configuration, for example, creates a crystalline on insulator (COI) substrate, such as silicon on insulator substrate (SOI). Other types of COI substrates may also be useful. The COI substrate may include features and device layers which form a MEMS device. The support substrate includes first contact pads 146 and first conductive traces 140 on a first major surface 122, second contact pads 156 with package contacts 160 and second conductive traces 150 on a second major surface 124 and interconnects 170, as described in FIG. 1a.

Figure 1C:
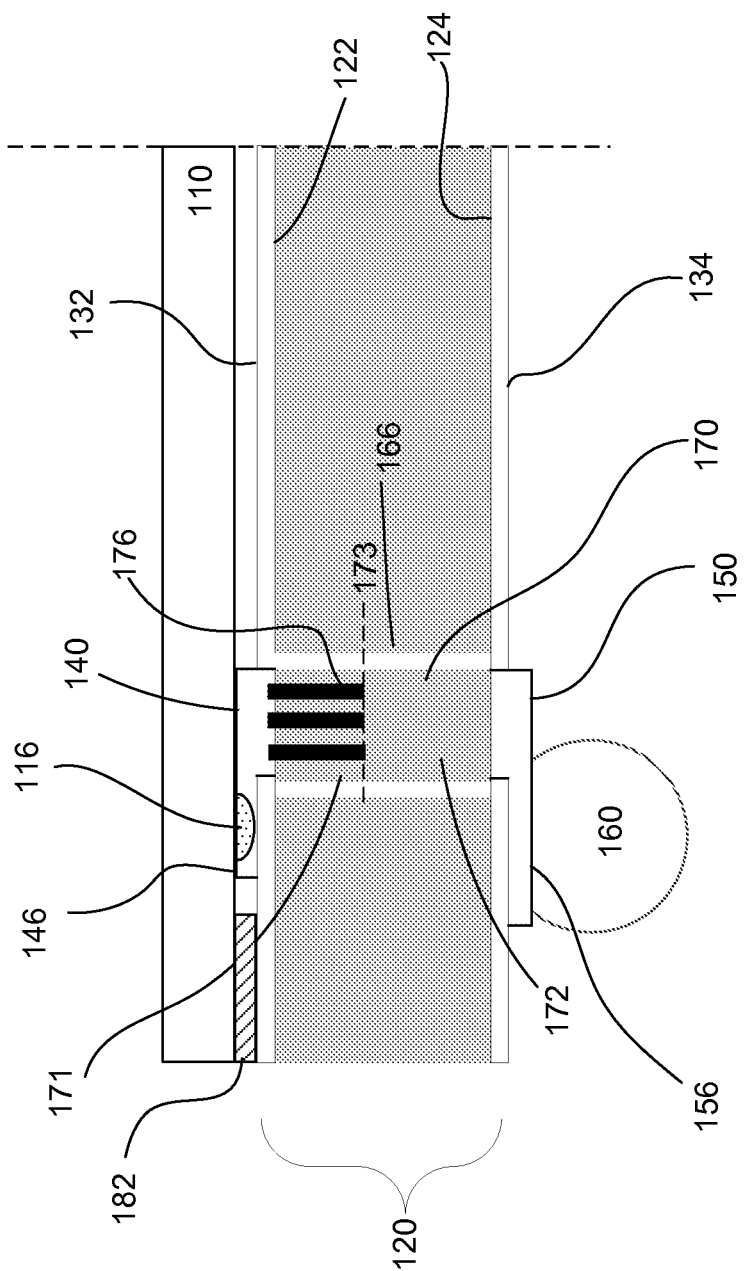
Figure 1D:
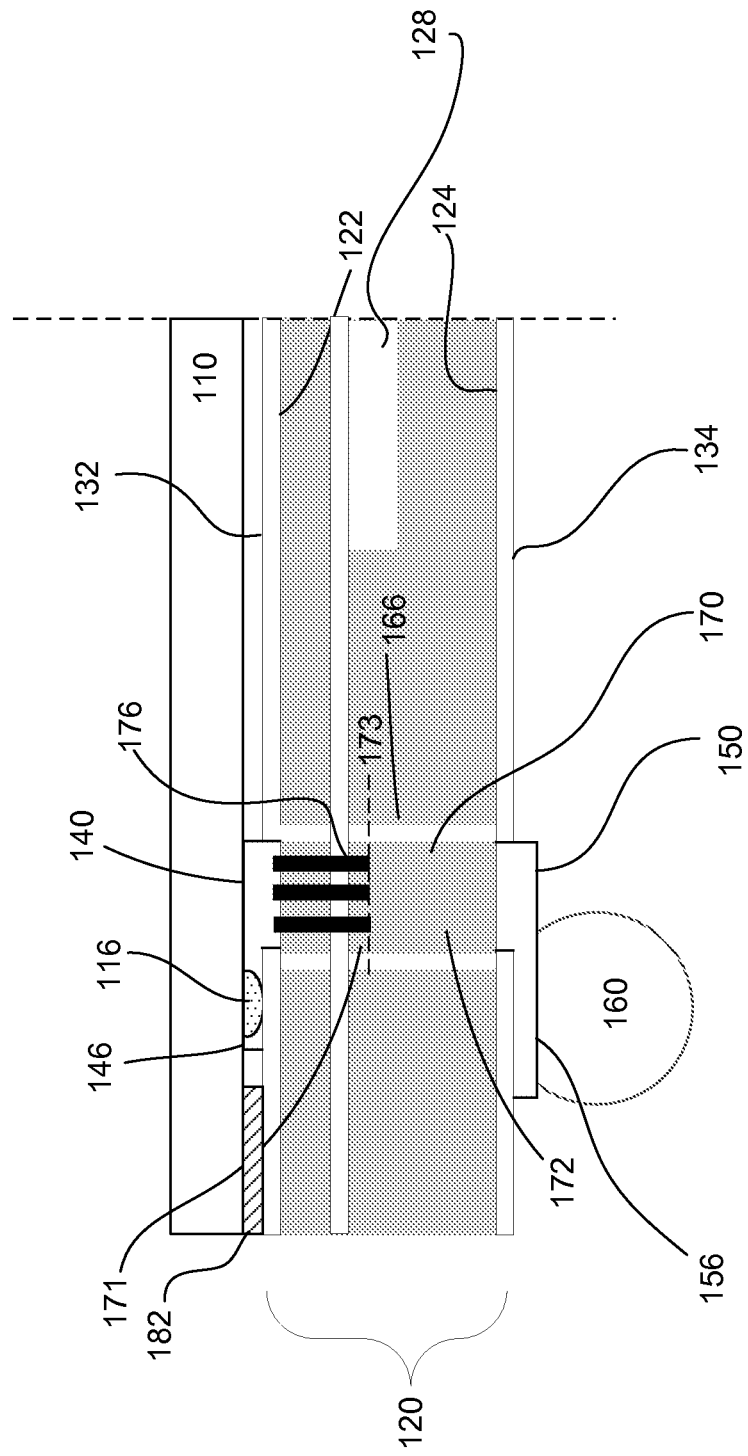

FIGS. 1c-d show other embodiments of devices 100. The devices, as shown, include support substrates, similar to that shown in FIGS. 1a-b. Similar reference numerals designate similar elements. Similar elements may not be discussed in detail. Referring to FIGS. 1c-d, a support substrate 120 is provided. The support substrate, for example, comprises a semiconductor material and serves as a handler substrate. In some embodiments, the handler substrate may include a cavity substrate with a cavity 128, as shown in FIG. 1d. The support substrate may be a MEMS device. The support substrate includes first contact pads 146 and first conductive traces 140 on a first major surface 122, second contact pads 156 with package contacts 160 and second conductive traces 150 on a second major surface 124 and interconnects 170.

In one embodiment, a semiconductor device 110 is mounted on the first surface of the support substrate. In one embodiment, the semiconductor device may be attached to the support substrate using a eutectic bond 182. The eutectic bond may comprise materials such as Al, Cu, Au, Ag, In, Sn, Ge, solder, Si or a combination thereof. In some embodiments, the eutectic bond may comprise Al—Ge or Si—Ni. Eutectic bonding can serve as an interconnect between the support substrate and semiconductor device. Additionally, the eutectic bonding may form a hermetic seal between the support substrate and semiconductor device, serving as an hermetic bond. In other embodiments, the semiconductor device may be attached to the support substrate using adhesive bonds such as BCB, SU8 or SU8 with Si nano particles. Providing other adhesives or bonding methods such as Glass Frit may also be useful, depending on the process requirements.

The semiconductor device, for example, is a flip chip. The flip chip includes chip contacts 116 on a contact surface. The chip contacts can be arranged in, for example, rows such as single or dual in line flip chip. In other embodiments, the chip contacts may be arranged in a BGA format. Arranging the chip contacts in other configurations may also be useful. The chip contacts are mated to the first contact pads on the support substrate.

In other embodiments, the semiconductor device may be other types of semiconductor devices. For example, the semiconductor device may include bond pads. The bond pads may be coupled to the first contact pads of the support substrate by, for example, wire bonds. Other techniques for coupling a semiconductor device to the support substrate may also be useful.

FIGS. 2a-b show cross-sectional and plan views of an embodiment of an interconnect 170 in greater detail. The interconnect extends from the first and second major surfaces 122 and 124 of the substrate 120. The interconnect, for example, provides electrical connection between elements, such as electrical traces, on the first and second major surfaces. An interconnect dielectric 166 surrounds the interconnect to isolate the interconnect from other parts of the support substrate.

The interconnect, as shown, comprises a rectangular cross-sectional shape. Other cross-sectional shapes for the interconnect may also be useful. The diameter of the cross-section of the interconnect maybe about 40 μm. Other sizes for the interconnect may also be useful.

The interconnect is heavily doped with dopants. In one embodiment, the interconnect is heavily doped with dopants of a first polarity type. The interconnect includes first and second portions 171 and 172. The first portion, as shown, is from the first major surface and the second portion is from the second major surface of the substrate. An interface 173 of the first and second portions of the interconnect is disposed within the substrate.

The first portion of the interconnect includes at least one partial conductive via plug 176. In one embodiment, the first portion includes a plurality of partial conductive via plugs $176_1$-$176_i$. The partial via plugs have surface ends extending from the major surface and inner ends at about the interface of the first and second portions of the interconnect. The via plugs, for example, may have a rectangular cross-sectional shape as shown in FIG. 2a. Providing other shapes or a combination of different cross-sectional shapes may also be useful. The cross-sectional shape selected should facilitate forming void free via plugs. For example, the cross-sectional shape facilitates forming polysilicon via plugs or via plugs of other conductive materials. The cross-section of the via plug may, for example, have a dimension of about 1 μm. Other dimensions for the cross-section may also be useful.

The via plugs may be arranged in an array configuration. For example, the via plugs may be arranged in a M×N matrix. As shown in FIG. 2b, the via plugs are arranged in a 5×5 (M=5 and N=5) matrix. It is understood that N need not equal to M. Other configurations of the via plugs may also be useful. For example, a row need not have the same number of via plugs as other rows or a column need not have the same number of via plugs as other rows.

The partial via plugs, in one embodiment, comprise polysilicon. The polysilicon is heavily doped with dopants of the first polarity type. The dopant concentration of the first polarity type, for example, depends on the equipments capability. The use of polysilicon facilitates compatibility with front end processes. For example, by being compatible with front end processes, high temperature processes may be employed.

In other embodiments, the partial via plugs comprise other types of conductive materials, such as copper, copper alloy, aluminum, tungsten and/or a combination thereof. Other types of conductive materials may also be used, depending on the process and temperature requirements.

It is understood that via plugs of different interconnects need not comprise the same material. For example, some interconnects may be formed from doped polysilicon while others are formed from other types of conductive materials. Similarly, in some cases, via plugs of an interconnect need not all comprise the same material.

The location of the interface of the first and second portions, for example, determines the depth of the partial via plugs. The depth of the via plugs, for example, may range from about 2 µm to 200 µm. For example, the depth of the via plugs may be about 80 µm. Other depths for the via plugs may also be useful. The dimensions of the via plugs, such as cross-sectional, size and depth may depend on design requirements, such as resistance of the via plug. The resistance, for example, may depend on the material, concentration of dopants (if applicable), cross-sectional size and depth of the via plug. In addition, the overall resistance of the interconnect is taken into consideration regarding the design of the interconnect. This includes, for example, resistance of the via plugs, number of via plugs as well as the substrate material and doping concentration.

As shown, the first portion containing the via plug or via plugs is disposed in an upper portion of the interconnect. For example, the first portion is from the upper (or first) surface of the substrate. In other embodiments, the first portion may be a lower portion of the interconnect. For example, the first portion is formed from the lower surface (or second) surface of the substrate. Furthermore, it is understood that all the interconnects of the support substrate need not have the same via plug layout. For example, different interconnects may be provided with different via plug layouts, depending on, for example, design requirements.

Figure 3:
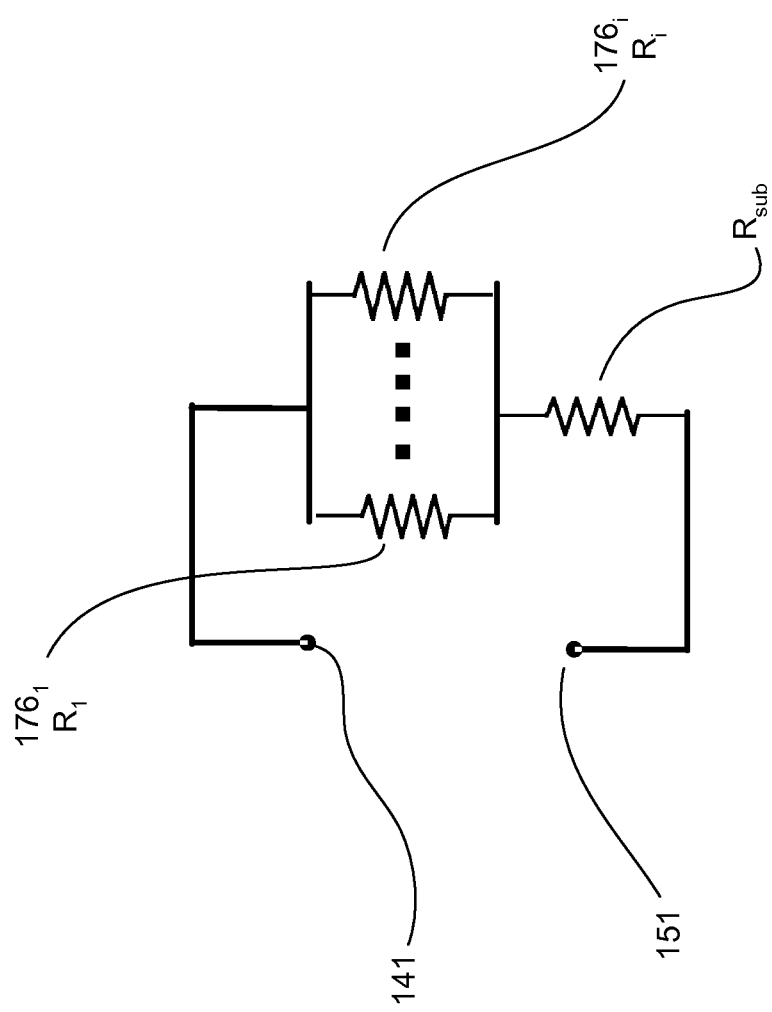
FIG. 3 shows a circuit model of an embodiment of an interconnect.

FIG. 3 shows a circuit model of an embodiment of an interconnect 170. The various resistance components between a first end 141 and a second end of 151 of the interconnect are represented. The first end is part of the first portion 171 of the interconnect and the second end is part of the second portion 172 of the interconnect.

In one embodiment, the first portion of the interconnect includes a plurality of first resistance components $R_1$-$R_i$ coupled in parallel. The first resistance components correspond to via plugs $176_1$-$176_i$. In the case where the first portion includes a single plug, the first portion includes a single first resistance component. The first resistance component or components are coupled in series with a second resistance component in the second portion of the interconnect. The second resistance component corresponds to the resistance of the substrate material $R_{sub}$. For example, the second resistance component corresponds to the resistance of the second or lower portion of the full interconnect. The total resistance between the first and second ends of the interconnect can be defined by Equation 1 as follows:

$$R_{total} = \frac{R_{plug}}{N} + R_{sub} \qquad \text{(Equation 1)}$$

The variables of Equation 1:
$R_{total}$ is the total resistance of the interconnect;
$R_{plug}$ is the resistance of a via plug;
N is the number of via plugs in the first portion; and
$R_{sub}$ is the resistance of the second portion of the interconnect.

Equation 1 assumes that the resistance of the via plugs are all the same resistance. In the case where via plugs are not all the same resistance, the total resistance may be determined by modifying Equation 1 accordingly. For example, one or more via plugs of a via layout may have different cross-sections from other via plugs.

In addition, resistance is defined by Equation 2 as follows:

$$r = \frac{\rho L}{A} \qquad \text{(Equation 2)}$$

The variables for Equation 2:
$\rho$ is the resistivity of the material;
L is the length of the resistor; and
A is the cross-sectional area of the resistor.

Based on Equations 1 and 2, an interconnect having a total resistance of about 1Ω may be obtained according to an exemplary analytical calculation as shown in the following Table 1.

TABLE 1

|  | N | $\rho$ (Ω · cm) | L (µm) | Ø (µm) | R (Ω) |
| --- | --- | --- | --- | --- | --- |
| Substrate |  | 0.001 | 100 | 40 | ≈0.8 |
| Via plug | 100 | 0.001 | 8 | 1 | ≈0.2 |

Therefore, the desired total resistance of the interconnect may be obtained by modifying the variables of Equations 1 and 2.

As described, interconnects can be formed with the desired resistance requirements without the need to form through vias. Forming deep vias in crystalline material, such as silicon, requires long etching time. This negatively impacts throughput time, resulting in increased manufacturing cost. As such, providing interconnects using partial vias increases manufacturing efficiency and reduces cost while satisfying performance or design requirements.

Figure 4A:
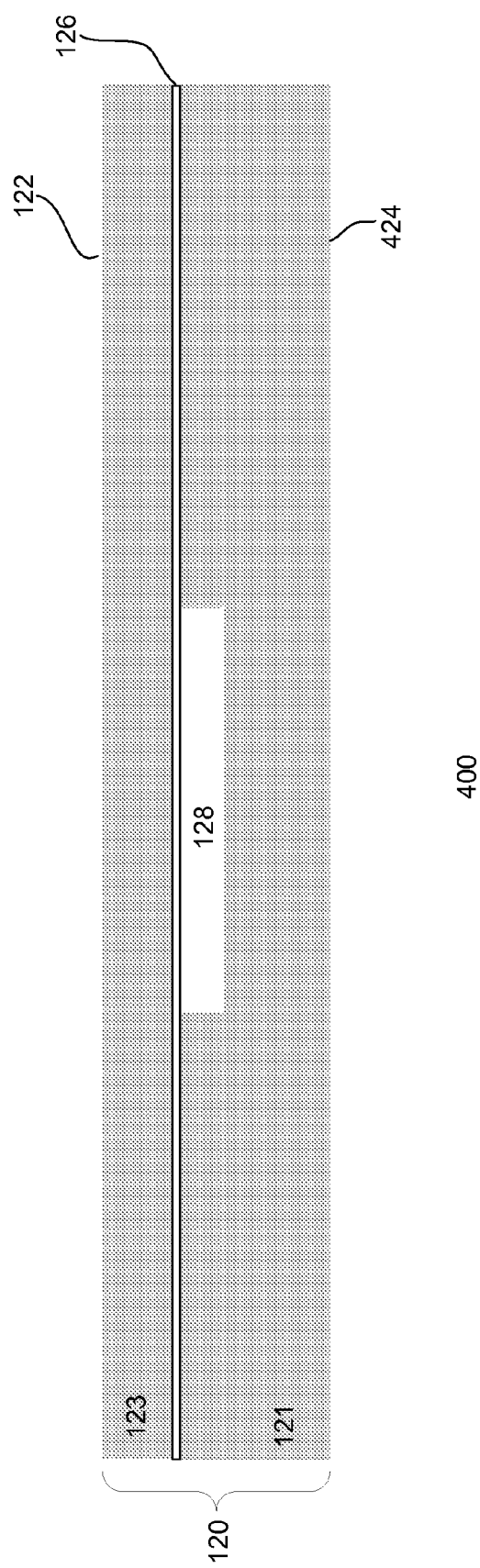

FIGS. 4a-k show cross-sectional views of an embodiment of a process 400 for forming device. Referring to FIG. 4a, a support substrate 120 is provided. The substrate includes first and second major surfaces 122 and 424. The support substrate may serve as a handler substrate or handler wafer. For example, the handler substrate may be a package or a part of a package of the device. In the case of a handler wafer, it may be used for wafer level packaging.

The support substrate, in one embodiment, comprises a semiconductor material, such as a crystalline material. For example, the support substrate comprises silicon. Other types of semiconductor materials, such as silicon-germanium (SiGe), germanium (Ge), gallium-arsenic (GaAs) or any other suitable semiconductor materials, including subsequently developed materials, may also be used to serve as the support structure.

The initial thickness of the support substrate, in one embodiment, is greater than a final thickness of the support substrate. For example, the initial thickness of the support substrate may be from about 400-725 µm and the final thickness of the support substrate may be from about 50-200 µm. Other thicknesses or thickness ranges may also be useful. By providing a support substrate having a thicker than desired thickness facilitates processing. The substrate may be thinned by, for example, grinding to provide a support substrate with the final and desired thickness.

In one embodiment, the support substrate is heavily doped with dopants of the first polarity type. In one embodiment, the handler substrate may be a heavily doped p-type (p⁺) or a heavily doped n-type (n⁺) substrate. P-type dopants can include boron (B), aluminum (Al), indium (In) or a combination thereof, while n-type dopants can include phosphorus (P), arsenic (As), antimony (Sb) or a combination thereof. In one embodiment, the substrate is an n⁺ substrate. The dopant concentration of the substrate should be sufficient to provide a low sheet resistance. The dopant concentration, in one embodiment, should be sufficient to provide a sheet resistance of about 0.05 Ωcm or lower. Providing a substrate having other sheet resistance values may also be useful. In other embodiments, the substrate may be an intrinsic substrate.

The support substrate, in one embodiment, comprises a cavity substrate. The cavity substrate includes a cavity 128. The cavity substrate, for example, may be used to form MEMS devices. Providing a non-cavity substrate which forms a MEMS device may also be useful. In other embodiments, the support substrate may serve as a package or package structure of a device.

In one embodiment, the cavity substrate includes a main or bulk substrate 121 with a cavity 128. The surface of the bulk substrate without the cavity, for example, serves as the second surface of the support substrate. A surface substrate 123 is disposed on the bulk substrate with the cavity. A top surface of the surface substrate, for example, serves as the first surface of the support substrate. The substrates may comprise silicon. Other types of crystalline material may also be useful. It is understood that the bulk and surface substrates need not be formed form the same type of materials.

A buried dielectric layer 126 may optionally be provided between the bulk and surface substrates. The buried dielectric layer may be, for example, silicon oxide. Other types of dielectric materials may also be used to form the buried dielectric layer. The initial thickness of the bulk substrate may be from about 500-725 μm and the final thickness of the bulk substrate may be from about 50-200 μm, the thickness of the buried dielectric layer may be from about 0.5 to 4 μm and the thickness of the surface substrate may range from about 2-50 μm. For example, the thickness of the surface substrate may be from about 2-38 μm. Other thicknesses for the different layers of the support substrate may also be useful. Such a configuration, for example, creates a crystalline on insulator (COI) substrate, such as silicon on insulator substrate (SOI). The COI substrate may include features and device layers which form a MEMS device.

Figure 4B:
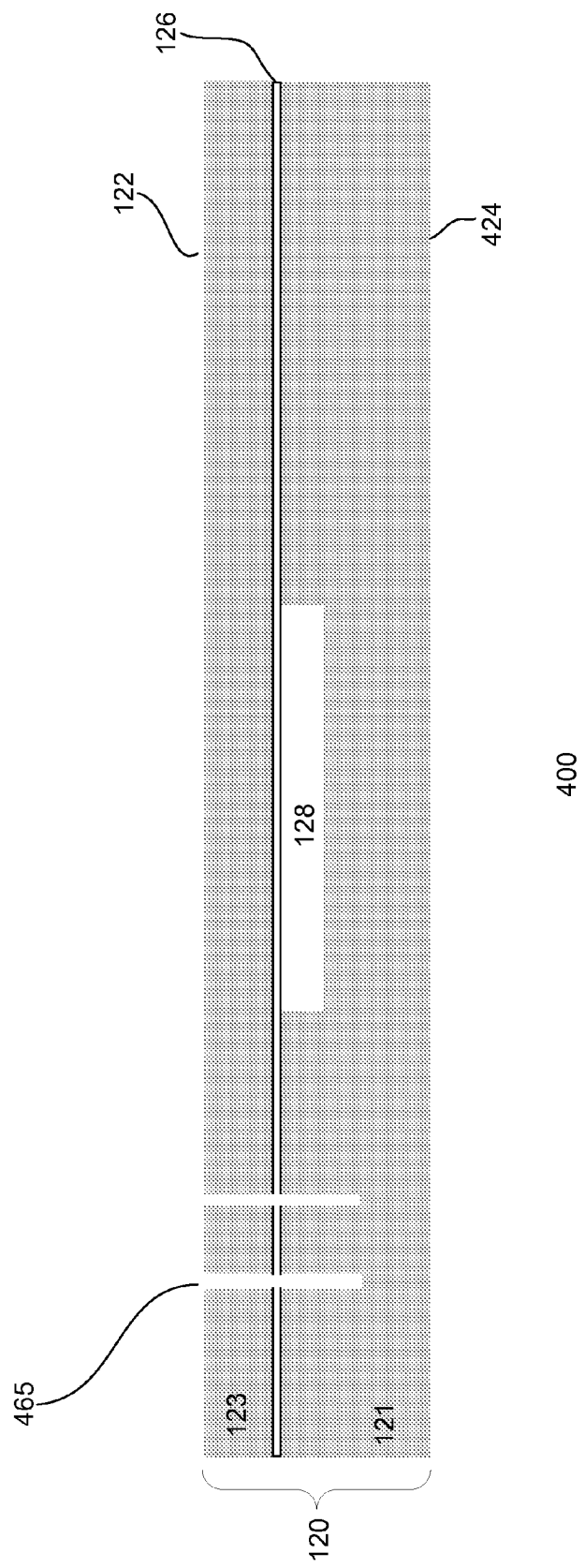

In FIG. 4b, the support substrate is patterned to form an interconnect isolation trench 465. In one embodiment, the interconnect isolation trench is patterned from the first surface of the support substrate. Patterning of substrate may be achieved using mask and etch techniques. For example, a hard mask, such as silicon oxide, may be employed. Other types of hard masks may also be useful. The hard mask may be patterned to form an opening corresponding to interconnect dielectric. To pattern the hard mask, a soft mask, such as a photoresist, may be used. The photoresist is selectively exposed and developed to form an opening to expose the hard mask corresponding to the interconnect isolation trench. To improve lithographic resolution, an anti-reflective coating (ARC) can be provided beneath the photoresist. The pattern of the soft mask is transferred to the hard mask by, for example, a reactive ion etch (RIE) to expose the surface of the support substrate.

A deep RIE (DRIE) is employed to form the interconnect isolation trench. The DRIE, for example, etches through the surface substrate, buried dielectric layer and a portion of the bulk substrate. Other techniques for patterning the support substrate to form the interconnect isolation trench are also useful. After patterning the support substrate, the various mask layers may be removed to expose the surface of the support substrate.

In one embodiment, the DRIE forms the interconnect isolation trench. The DRIE may form isolation trenches with a sidewall profile or angle of about 90°. For example, the DRIE may form isolation trenches with a sidewall angle of about 89°±0.5°. Other sidewall angles may also be useful for the isolation trenches. Re-entering profiles should be avoided for the trench since this may cause voids in the trench fill material.

The isolation trench, for example, surrounds the interconnect. The thickness of the trench may be about 2 μm. Other thicknesses may also be useful. The thickness may depend on different factors, for example, aspect ratio capability of the DRIE and/or electrical isolation requirements. For example, the minimum width may be determined by the desired depth of the trench and aspect ratio capability of the DRIE. The depth of the isolation trench should be at least as or deeper than the final thickness of the support substrate. Preferably, the isolation trench is deeper than the final thickness increase processing window. For example, the depth of the trench may be slightly deeper than 80 μm for a support substrate with a final thickness of about 80 μm. Although only one interconnect isolation trench is formed for one interconnect, it is understood that additional interconnect trenches may be formed for additional interconnects.

Figure 4C:
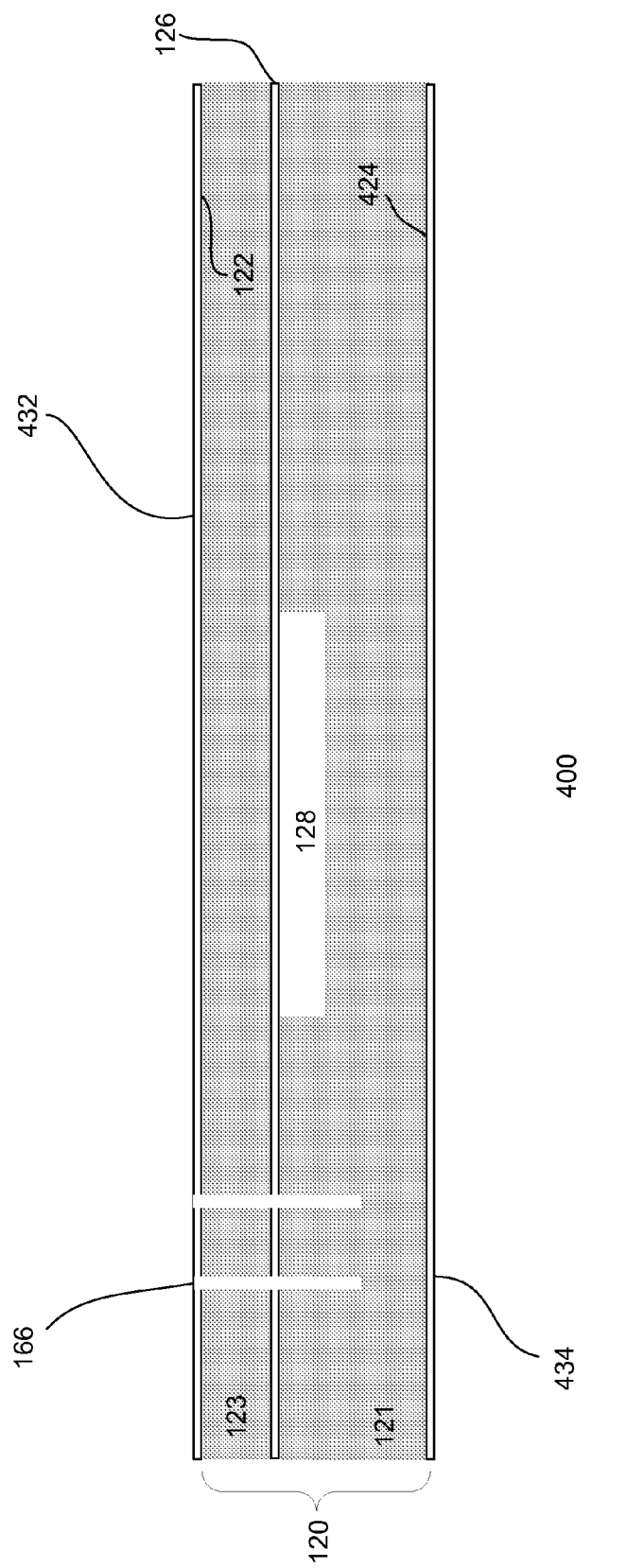

Referring to FIG. 4c, the interconnect isolation trench is filled with a dielectric material. The isolation trench, for example, is filled with silicon oxide. The silicon oxide may be deposited by LPCVD or wet thermal oxidation. These deposition techniques are conformal. Other techniques for filling the dielectric material may also be useful. Excess dielectric material over the substrate is removed to form the interconnect dielectric 166. Removing the excess material, in one embodiment, comprises a planarizing process, such as chemical mechanical polishing (CMP). Other types of planarizing processes may also be useful. The planarizing process forms a planar top surface between the dielectric layer and support substrate surface. After the planarizing process, the substrate surfaces may be coated with first and second surface dielectric layers 432 and 434. The surface dielectric layers may comprise silicon oxide. Other types of dielectric materials may also be useful.

Figure 4D:
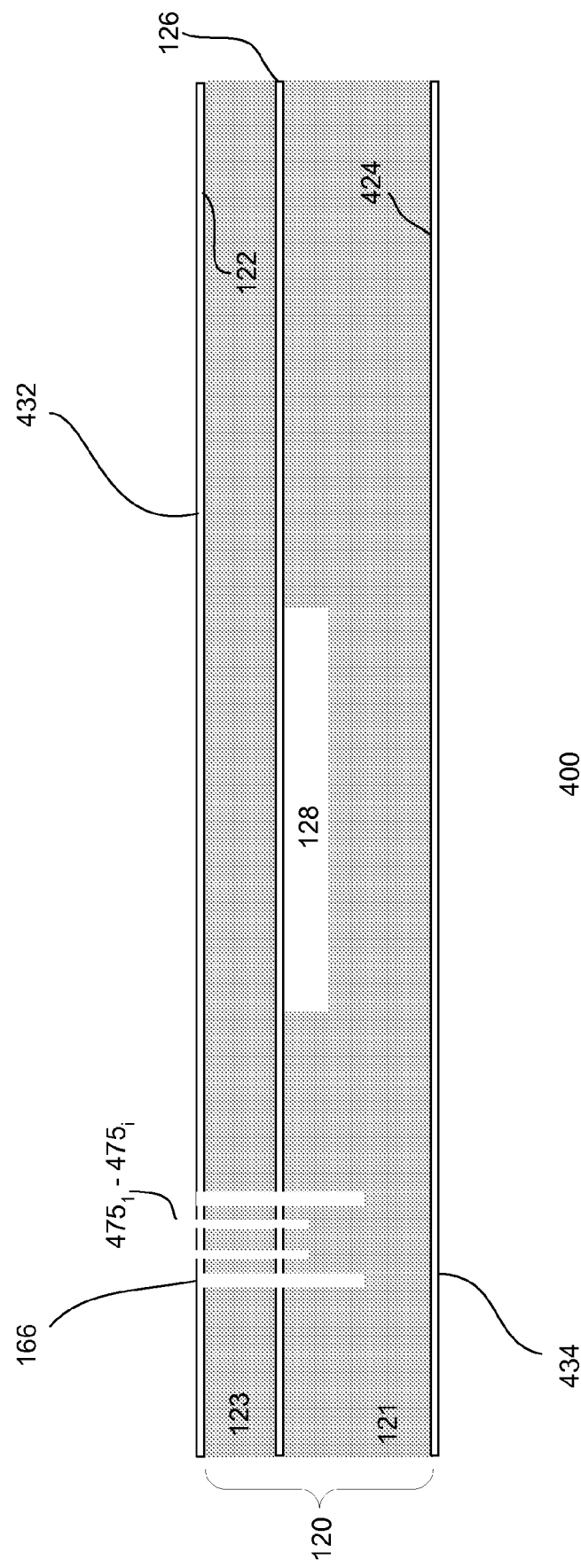

In FIG. 4d, the substrate is patterned to form partial vias 475₁-475ᵢ. Patterning of the substrate may be achieved using mask and etch techniques. For example, a hard mask, such as silicon oxide, may be employed. Other types of hard masks may also be useful. The hard mask may be patterned to form openings corresponding to the partial vias. To pattern the hard mask, a soft mask, such as a photoresist may be used. The photoresist is selectively exposed and developed to form openings to expose the hard mask corresponding to the partial vias. To improve lithographic resolution, an anti-reflective coating (ARC) can be provided beneath the photoresist. The pattern of the soft mask is transferred to the hard mask by, for example, reactive ion etch (RIE) to expose the surface of the support substrate.

A deep RIE (DRIE), for example, is employed to form the partial vias. In one embodiment, the DRIE forms the vias with a sidewall profile or angle of about 90°. For example, the DRIE may form vias with a sidewall angle of about 89°±0.5°. Other sidewall angles may also be useful for the vias. Re-entering profiles should be avoided for the vias since this may cause voids in the via fill material.

The depth of the vias is at about the interface of the first and second portion of the interconnect. In the case where a buried dielectric layer separates the surface substrate and bottom or bulk substrate, the interface of the first and second portion is disposed below the buried dielectric layer in the bulk substrate. For example, the interface or depth of the vias may be about 3-10 μm into the bottom substrate. Other depths may also be useful. The depth of the vias, for example, may depend on factors, such as depth of the buried dielectric layer, desired total resistance of the interconnect, and/or the final thickness of the support substrate.

In some embodiment, a single partial via may be formed for the interconnect. In one embodiment, the cross-section of the partial vias may be rectangular in shape. Other cross-sectional shapes may also be useful. The diameter of the cross section may be about 1 μm. Other sizes for the cross-section of the partial vias may also be useful. It is also understood that not all partial vias of the layout have the same cross-sectional shape and/or size.

Figure 4E:
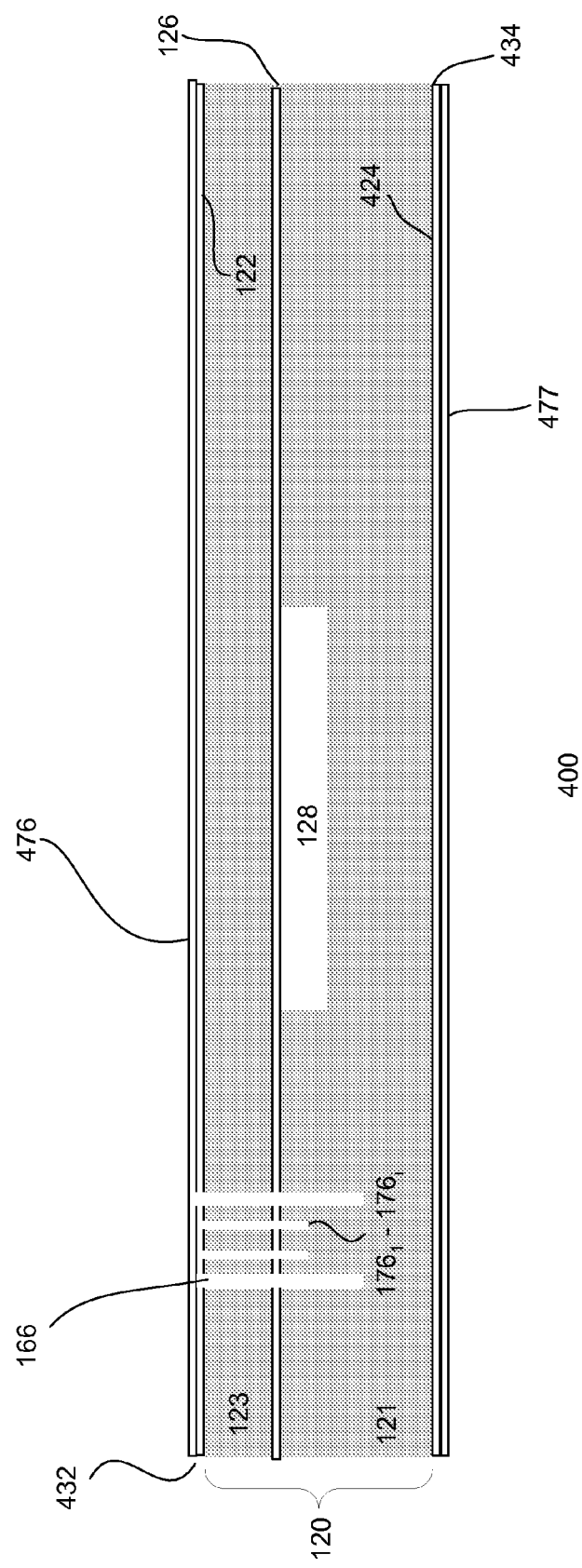

As shown in FIG. 4e, a conductive material 476 is deposited on the substrate, filling the partial vias. Prior to filling the partial vias, native oxide and post etch layers which may be produced by the etch to form the partial vias should be avoided or removed. Removal of such layers may be achieved by, for example, a clean or wet etch process In one embodiment, the partial vias are filled with polysilicon to form via plugs $176_1$-$176_i$. The filling of the partial vias with polysilicon may be achieved by, for example, chemical vapor deposition (CVD). Other techniques for filling the partial vias may also be useful. In one embodiment, the partial vias are filled with heavily doped polysilicon. In one embodiment, the partial vias are filled with heavily doped polysilicon with first polarity type dopants. The heavily doped polysilicon may be in-situ doped. The doping concentration of the polysilicon may be about 2e20 atm/cm$^3$. As shown, the polysilicon also coats the bottom of the support substrate. For example, the polysilicon coats the dielectric layer on the bottom of the support substrate, forming a bottom polysilicon layer 477.

In other embodiments, the partial vias are filled with other types of conductive material. For example, the partial vias may be filled with a metallic material or an alloy. Such materials may include, for example, copper, copper alloy, tungsten, aluminum or a combination thereof. Depending on process requirement, the conductive material may also coat the bottom of the support substrate.

Figure 4F:
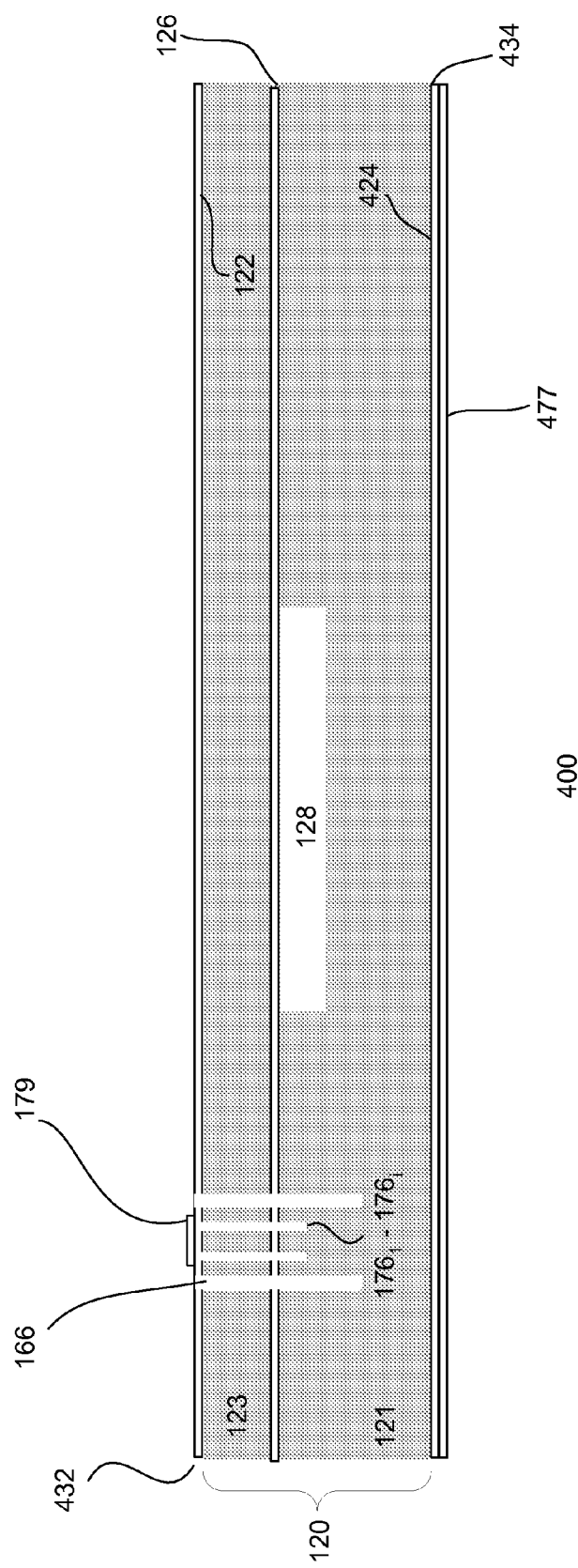

In FIG. 4f, excess conductive material over the surface of the support substrate is removed, leaving a via pad 179 coupled to the via plugs. Removal of the excess conductive material may be achieved with an etch back process, using, for example, an etch mask. The etch mask protects the conductive material where the via pad is formed, allowing the unprotected conductive material to be removed. The etch back process may remove the conductive material selective to the surface dielectric layer 432.

As shown in FIG. 4g, a dielectric layer 433 is formed on the first surface dielectric layer. The dielectric layer increases the thickness of the first surface dielectric layer 432 and is used to isolate the via. In one embodiment, the dielectric layer comprises silicon oxide. The silicon oxide may be formed by, for example, PECVD. Other types of dielectric materials or deposition techniques may also be employed. In one embodiment, the dielectric layer 433 may be the same material as the first surface dielectric layer. Providing dielectric layers of different dielectric materials may also be useful.

Referring to FIG. 4h, a contact opening 478 is formed in the dielectric layer 433 to expose the via pad. The contact opening may be formed using mask and etch techniques. For example, a soft mask may be patterned by exposure to an exposure source through a reticle and developed to remove unwanted mask material to create an opening. The pattern of the soft mask is transferred to the dielectric layer RIE to create the opening to expose the via pad.

Figure 4I:
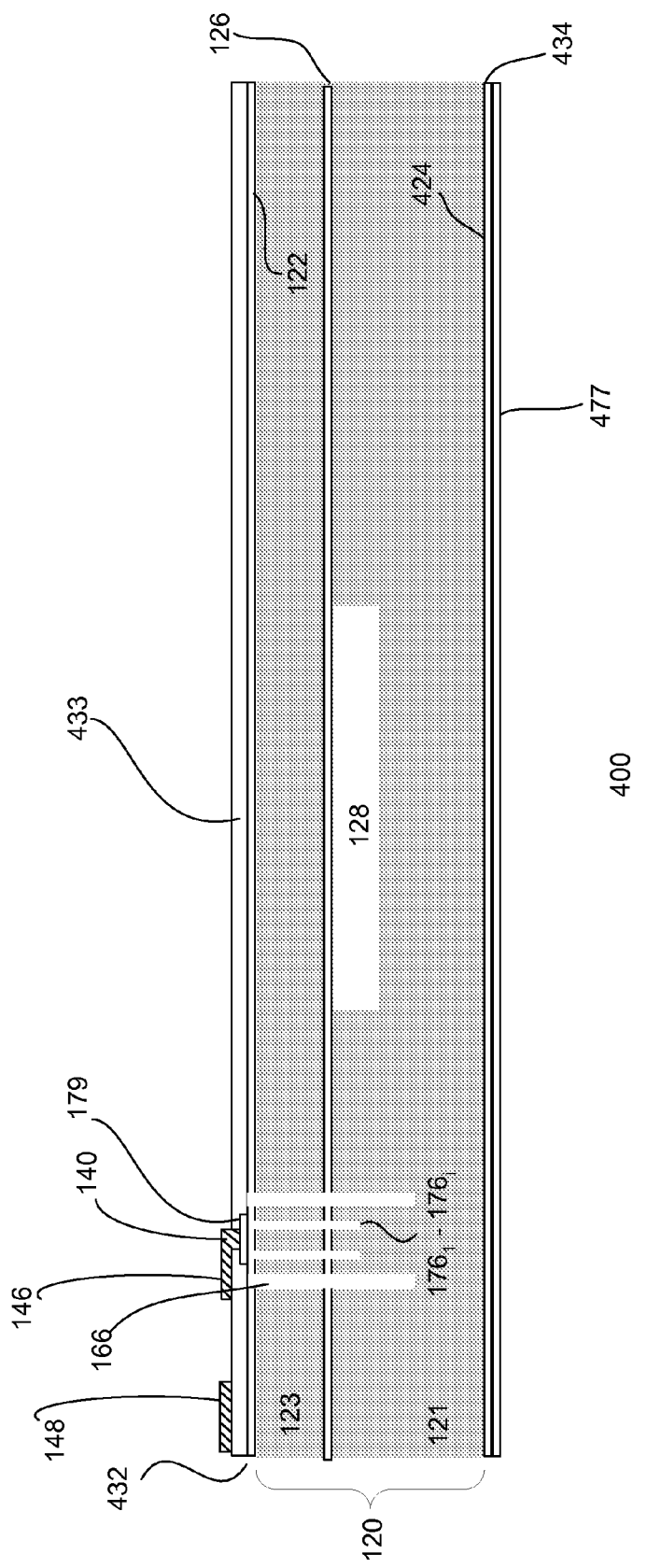

A conductive trace 140 is formed on the dielectric layer over the first surface of the support substrate, as shown in FIG. 4i. The conductive trace, for example, may be formed by depositing a conductive material on the dielectric layer and filling the contact opening. The conductive material may be, for example, copper or copper alloy. The conductive material may be deposited by PVD. For example, the conductive material may be deposited by sputtering or evaporation. Other types of conductive materials or deposition techniques may also be useful. The conductive layer may be patterned, using for example mask and etch techniques, to form conductive traces, including a first contact pad 146 and a second contact pad 148. The patterned conductive layer, for example, serves as a RDL to provide connection between the contact pad and interconnect.

Figure 4J:
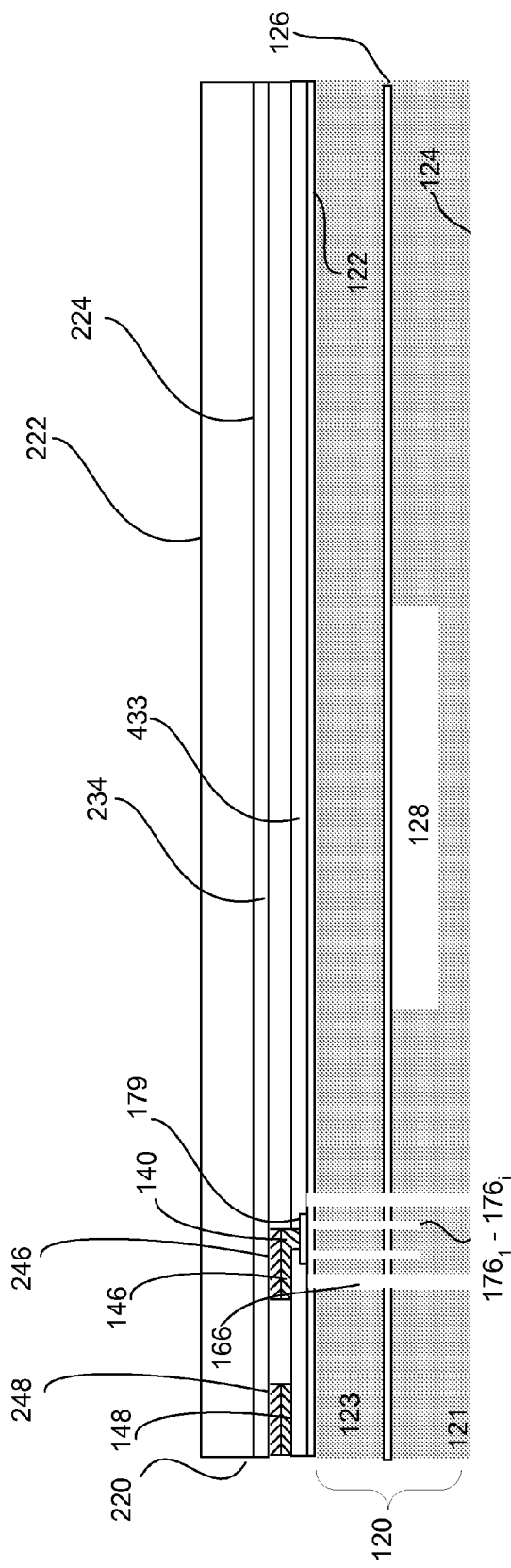

Referring to FIG. 4j, a semiconductor device 220, such as a CMOS device is attached to the support substrate. Providing other types of device is also useful. In one embodiment, the semiconductor device is attached to the first surface of the support substrate using eutectic bond. The eutectic bond may comprise materials such as Al, Cu, Au, Ag, In, Sn, Ge, solder or Si. In other embodiments, the semiconductor device may be attached to the support substrate using adhesive bonds such as BCB, SU8 or SU8 with Si nano particles. Providing other adhesives or bonding methods such as Glass Frit may also be useful, depending on the process requirements.

The semiconductor device includes a substrate having first and second major surfaces. The first major surface 222 forms the top surface of the semiconductor device, whereas the second major surface 224 forms the bottom surface of the semiconductor device. A dielectric layer 234 is formed below the second major surface of the semiconductor device. A conductive layer is formed below the dielectric layer. The conductive layer may be patterned, using for example mask and etch techniques, to form conductive traces, including a first 246 and a second contact pad 248. The patterned conductive traces of the semiconductor device, for example, provide electrical connection between the contact pads and the interconnect of the support substrate.

As shown in FIG. 4j, the support substrate is thinned to the desired thickness by removing materials from the second surface. The attached semiconductor device on top of the support substrate, therefore, serves as support for thinning the support substrate. The conductive layer and surface dielectric layer on the second substrate surface of the support substrate, for example, are removed by an etch. For example, a dry or wet etch may be employed to remove the conductive layer and surface dielectric layer on the second substrate surface of the support substrate. The support substrate is then thinned by grinding. After the support substrate has been thinned to the desired thickness, the interconnect which is surrounded by the interconnect dielectric is exposed.

Figure 4K:
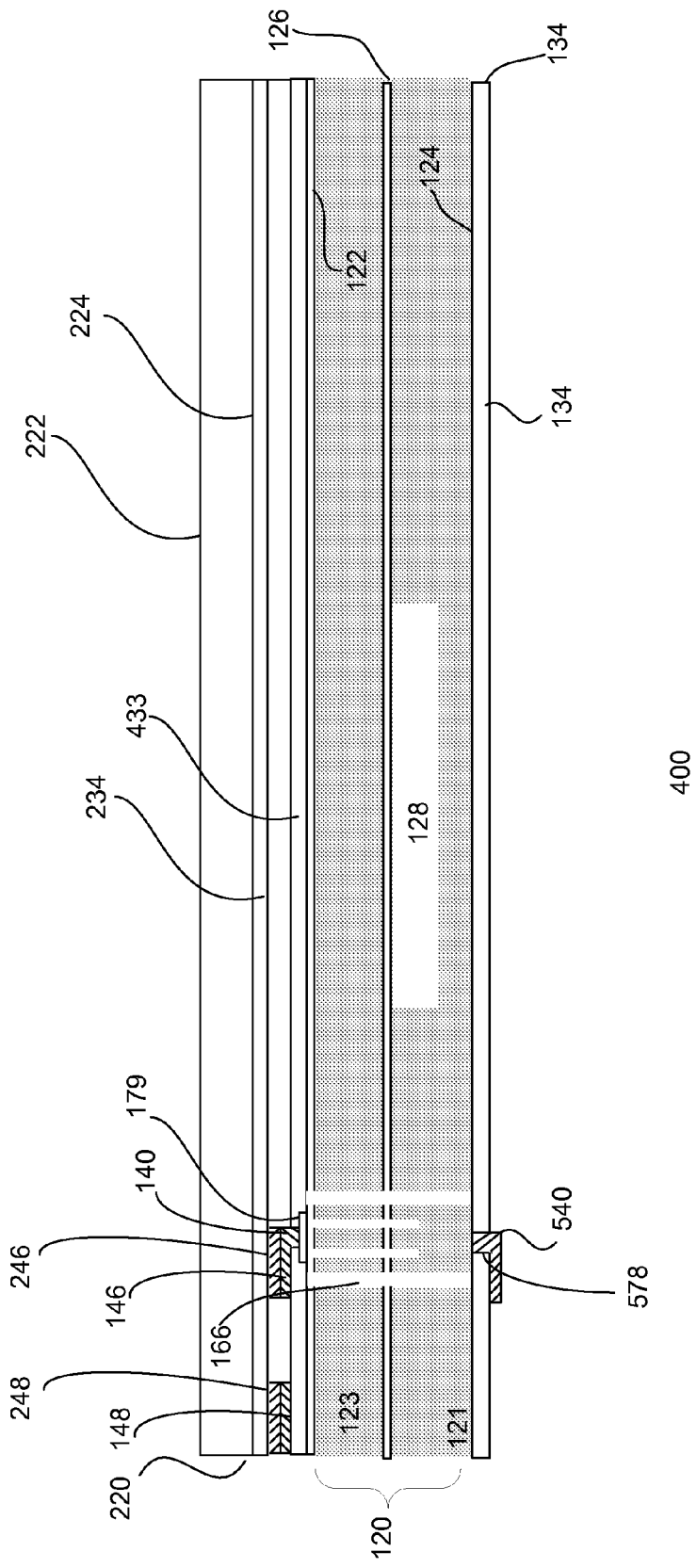

A surface dielectric layer 134 is formed on the second surface 124 of the support substrate, as shown in FIG. 4k. A contact opening 578 is formed in the dielectric layer 134 to expose the interconnect. The contact opening may be formed using mask and etch techniques. For example, a soft mask may be patterned by exposure to an exposure source through a reticle and developed to remove unwanted mask material to create an opening. The pattern of the soft mask is transferred to the dielectric layer RIE to create the opening to expose the substrate.

A conductive trace 540 is formed on the dielectric layer 134 over the second surface of the support substrate. External contacts, such as contact balls may be formed at the contact openings.

The process continues, for example, to form contact opening to the interconnect, second conductive trace, and second contact pad on the second support surface. A package contact ball may be formed on the second contact pad. The process follows by dicing the support substrate having the semiconductor device thereover into individual package.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method for forming a device comprising:
   providing a support substrate having first and second major surfaces;
   forming an interconnect through the first and second major surfaces in the support substrate, the interconnect having first and second portions, the first portion extends from one of the first or second major surfaces and the second portion extends from other of the first and second major surfaces, wherein forming the interconnect includes
      forming a partial via plug comprising a conductive material in the first portion of the interconnect, the via plug having a bottom at about an interface of the first and second portions, and
      providing the second portion of the interconnect with a heavily doped second portion with dopants of a first polarity type; and
   forming an isolation trench surrounding the interconnect to isolate the interconnect from portions of the support substrate.

2. The method of claim 1 wherein the conductive material comprises polysilicon.

3. The method of claim 2 wherein the polysilicon is doped with dopants of the first polarity type.

4. The method of claim 1 wherein the first polarity type is n type.

5. The method of claim 1 comprises filling the isolation trench with a dielectric material, wherein the dielectric material fills the isolation trench and over the first major surface of the support substrate.

6. The method of claim 5 comprises removing excess dielectric material over the support substrate to form a planar first surface dielectric layer over the first major surface of the support substrate.

7. The method of claim 1 wherein the partial via plug is formed by deep reactive ion etch.

8. The method of claim 1 wherein forming a partial via plug comprising
   patterning the support substrate to form a partial via;
   depositing a conductive material on the support substrate and filling the partial via; and
   removing excessive conductive material over the support substrate leaving a via pad coupled to the partial via plug.

9. The method of claim 8 comprises forming a dielectric layer over the first surface dielectric layer.

10. The method of claim 9 comprises forming a contact opening in the dielectric layer to expose the via pad.

11. The method of claim 10 comprises forming a conductive trace on the dielectric layer and coupled to the via pad.

12. The method of claim 1 comprises attaching a semiconductor device over the support substrate.

13. A method for forming a semiconductor package comprising:
   providing a support substrate having first and second major surfaces;
   forming an interconnect through the first and second major surfaces in the support substrate, the interconnect having first and second portions, the first portion extends from one of the first or second major surfaces and the second portion extends from other of the first and second major surfaces, wherein forming the interconnect includes
      forming a partial via plug comprising a conductive material in the first portion of the interconnect, the via plug having a bottom at about an interface of the first and second portions, wherein the conductive material comprises polysilicon which is doped with dopants of a first polarity type, and
      providing the second portion of the interconnect with a heavily doped second portion with dopants of the first polarity type; and
   providing a semiconductor device over the support substrate.

14. A device comprising:
   a support substrate having first and second major surfaces;
   an interconnect through the first and second major surfaces in the support substrate, the interconnect having first and second portions, the first portion extends from one of the first or second major surfaces and the second portion extends from other of the first and second major surfaces, wherein the interconnect includes
      a partial via plug comprising a conductive material in the first portion of the interconnect, the via plug having a bottom at about an interface of the first and second portions, and
      the second portion of the interconnect is heavily doped with dopants of a first polarity type; and
   an isolation trench surrounding the interconnect to isolate the interconnect from portions of the support substrate.

15. The device of claim 14 wherein the conductive material comprises polysilicon.

16. The device of claim 15 wherein the polysilicon is doped with dopants of the first polarity type.

17. The device of claim 14 wherein the first polarity type is n type.

18. The device of claim 14 wherein the isolation trench includes a dielectric material.

19. The device of claim 14 wherein the partial via plug comprises a surface end extending from the first major surface of the substrate.

20. The method of claim 1 wherein the partial via plug comprises a surface end extending from the first major surface of the substrate.

* * * * *